(12) United States Patent
Chen (10) Patent No.: US 11,197,391 B2
(45) Date of Patent: Dec. 7, 2021

(54) WATER COOLING HEAD, WATER COOLING RADIATOR AND ELECTRONIC EQUIPMENT

(71) Applicant: SHENZHEN XUNLING TECHNOLOGY CO., LTD., Guangdong (CN)

(72) Inventor: Kang Chen, Guangdong (CN)

(73) Assignee: SHENZHEN XUNLING TECHNOLOGY CO., LTD., Dongguan (CN)

( * ) Notice: Subject to any disclaimer, the term of this patent is extended or adjusted under 35 U.S.C. 154(b) by 0 days.

(21) Appl. No.: 16/896,317

(22) Filed: Jun. 9, 2020

(65) Prior Publication Data

US 2021/0195797 A1    Jun. 24, 2021

(30) Foreign Application Priority Data

Dec. 18, 2019   (CN) .......................... 201911312509.9

(51) Int. Cl.
*H05K 7/20*     (2006.01)
*G06F 1/20*     (2006.01)

(52) U.S. Cl.
CPC .......... *H05K 7/20272* (2013.01); *G06F 1/20* (2013.01); *H05K 7/20254* (2013.01)

(58) Field of Classification Search
CPC ........... H05K 7/20272; H05K 7/20218; H05K 7/20263; H05K 7/20772; G06F 1/20
See application file for complete search history.

(56) References Cited

U.S. PATENT DOCUMENTS

| 10,136,552 | B2* | 11/2018 | Liu | H05K 7/20272 |
| 10,791,648 | B1* | 9/2020 | Franz | F04D 29/5806 |
| 2004/0123614 | A1* | 7/2004 | Stewart | G06F 1/20 |
| | | | | 62/259.2 |
| 2004/0221603 | A1* | 11/2004 | Arik | F28F 3/04 |
| | | | | 62/259.2 |
| 2009/0044928 | A1* | 2/2009 | Upadhya | F28F 3/12 |
| | | | | 165/81 |
| 2009/0218072 | A1* | 9/2009 | Eriksen | G06F 1/206 |
| | | | | 165/80.2 |

(Continued)

FOREIGN PATENT DOCUMENTS

| CN | 103671059 A | 3/2014 |
| CN | 206332960 U | 7/2017 |

(Continued)

*Primary Examiner* — Stephen S Sul (57) ABSTRACT

The invention belongs to the technical field of water cooling radiators, and relates to a water cooling head, a water cooling radiator and an electronic equipment. The water cooling head includes a center module, a first water pump, a second water pump, and a heat exchange module. The center module is provided with a first water inlet channel, a second water inlet channel, a first water outlet channel, a second water outlet channel, a water inlet and a water outlet. The first water cavity is enclosed between the first water pump and the center module, and a second water cavity is enclosed between the second water pump and the center module, and a third water cavity is enclosed between the heat exchange module and the center module. The heat exchanging module is used for heat exchanging of the cooling liquid flowing through the third water cavity.

17 Claims, 9 Drawing Sheets

(56) References Cited

U.S. PATENT DOCUMENTS

| | | | | |
|---|---|---|---|---|
| 2013/0208421 A1* | 8/2013 | Chester | | H05K 7/20763 |
| | | | | 361/699 |
| 2014/0116661 A1* | 5/2014 | Xu | | G06F 1/20 |
| | | | | 165/133 |
| 2014/0362527 A1* | 12/2014 | Best | | H05K 7/2079 |
| | | | | 361/679.53 |
| 2017/0105313 A1* | 4/2017 | Shedd | | H05K 7/20309 |
| 2017/0235350 A1* | 8/2017 | Tsai | | G06F 1/20 |
| | | | | 165/80.4 |
| 2017/0367217 A1* | 12/2017 | Xiao | | H05K 7/20272 |
| 2018/0063993 A1* | 3/2018 | Wu | | H05K 7/20272 |
| 2018/0184549 A1 | 6/2018 | Wang | | |
| 2019/0037734 A1* | 1/2019 | Franz | | H05K 7/20781 |
| 2019/0110375 A1* | 4/2019 | Harrington | | H05K 7/20781 |
| 2019/0174653 A1* | 6/2019 | Fan | | H05K 7/20272 |
| 2019/0208665 A1* | 7/2019 | Tsai | | H05K 7/20263 |
| 2019/0239388 A1* | 8/2019 | Tsai | | H05K 7/20263 |
| 2019/0339026 A1* | 11/2019 | Chen | | F04D 1/04 |
| 2019/0343018 A1* | 11/2019 | Chen | | H05K 7/20263 |
| 2019/0380227 A1* | 12/2019 | Andre | | H05K 7/20272 |
| 2020/0053911 A1* | 2/2020 | Han | | G06F 1/20 |
| 2020/0113084 A1* | 4/2020 | He | | G06F 1/20 |
| 2020/0163257 A1* | 5/2020 | Franz | | H05K 7/20836 |
| 2020/0196483 A1* | 6/2020 | Lan | | H05K 7/20772 |
| 2020/0240417 A1* | 7/2020 | Shen | | F04D 13/066 |
| 2021/0088287 A1* | 3/2021 | Lan | | G06F 1/20 |

FOREIGN PATENT DOCUMENTS

| | | |
|---|---|---|
| CN | 207410652 U | 5/2018 |
| CN | 207882840 U | 9/2018 |
| CN | 109588001 A | 4/2019 |
| CN | 110099543 A | 8/2019 |
| CN | 209546177 U | 10/2019 |
| CN | 110440624 A | 11/2019 |
| CN | 209761753 U | 12/2019 |

* cited by examiner

WATER COOLING HEAD, WATER COOLING RADIATOR AND ELECTRONIC EQUIPMENT

CROSS REFERENCE TO RELATED APPLICATIONS

The present application claims the benefit of Chinese Patent Application No. 201911312509.9 filed on Dec. 18, 2019, the contents of which are incorporated herein by reference in their entirety.

TECHNICAL FIELD

The present disclosure belongs to the technical field of water cooling radiators, and particularly relates to a water cooling head, a water cooling radiator and an electronic equipment.

BACKGROUND

High temperature is the enemy of integrated circuits. High temperature will not only lead to unstable system operation, shortened service life, and even burn certain parts. The role of the radiator is to absorb the heat to ensure that the temperature of computer parts is normal. According to cooling methods, radiators can be divided into air cooling radiators, heat-piped radiators, water cooling radiators, semiconductor cooling radiators, and compressor cooling radiators, etc. Among them, the water cooling radiator uses a forced circulation of a cooling liquid to take away the heat of the radiator under the driving of a water pump. Compared with the air cooling radiators, it has the advantages of quietness, stable temperature reduction, and low dependence on the environment.

However, the water cooling head of the existing water cooling radiator is generally provided with only one water pump with an impeller. The cooling liquid flow capacity of a single water pump is limited, and thus the existing water cooling radiator has a poor heat dissipation effect. In addition, when the water pump fails, the water cooling radiator cannot continue to work normally, and this easily causes the CPU (Center Processing Unit) of an electronic device to be burnt out.

SUMMARY

The technical problem to be solved by the present disclosure is to provide a water cooling head, a water cooling radiator, and an electronic equipment for the technical problem of poor heat dissipation effect of the existing water cooling radiator.

To solve the above technical problems, according to an aspect, an embodiment of the present disclosure provides a water cooling head, which a center module, a first water pump, a second water pump, and a heat exchange module; wherein the center module is provided with a first water inlet channel, a second water inlet channel, a first water outlet channel, a second water outlet channel, a water inlet, and a water outlet; the first water pump, the second water pump, and the heat exchange module are respectively mounted on the center module; a first water cavity is enclosed between the first water pump and the center module, a second water cavity is enclosed between the second water pump and the center module, and a third water cavity is enclosed between the heat exchange module and the center module; the first water inlet channel and the second water inlet channel respectively communicate with the water inlet, the first water cavity communicates between the first water inlet channel and the first water outlet channel, the second water cavity communicates between the second water inlet channel and the second water outlet channel, the first water outlet channel and the second water outlet channel respectively communicate with the third water cavity, and the third water cavity communicates with the water outlet; the first water pump is used to introduce the cooling liquid from the water inlet which passes through the first water inlet channel, the first water cavity, the first water outlet channel, and the third water cavity in sequence, and discharge the cooling liquid from the water outlet; the second water pump is used to introduce the cooling liquid from the water inlet which passes through the second water inlet channel, the second water cavity the second water outlet channel, and the third water cavity in sequence, and discharge the cooling liquid from the water outlet; and the heat exchange module is used to perform heat exchange on the cooling liquid which flows through the third water cavity.

According to the water cooling head of the embodiment of the present disclosure, the cooling liquid is driven by two water pumps (a first water pump and a second water pump), so that the cooling liquid can flow into the water cooling head from the water inlet under the action of the two water pumps. After that, a part of the cooling liquid flows through the first water inlet channel and into the first water cavity under the action of the first water pump, and then flows through the first water outlet channel and into the third water cavity. Another part of the cooling liquid flows through the second water inlet channel and into the second water cavity under the action of the second water pump, and then flows through the second water outlet channel and into the third water cavity. Compared with the prior art, because the water cooling head according to the embodiment of the present disclosure uses two water pumps, the total flow of the cooling liquid is increased, thereby effectively enhancing the cooling effect of the water cooling head and the water cooling radiator containing the water cooling head. In addition, even if one of the water pumps of the water cooling head according to the embodiment of the present disclosure fails, the other water pump can still work normally, which effectively prevents the water cooling radiator from being not capable of working normally due to failure of a single water pump, thereby causing the CPU to be burnt out.

Optionally, the first water pump and the second water pump are both impeller pumps, the impeller of the first water pump is located in the first water cavity, and the impeller of the second water pump is located in the second water cavity.

Optionally, the impeller of the first water pump and the impeller of the second water pump rotate oppositely and independently.

Optionally, the center module includes a center body and a separation sheet, the center body includes a body of the center body, the body of the center body includes a middle part of the body, a first pipe section, and a second pipe section; an end of the first pipe section and an end of the second pipe section are respectively connected to the middle part of the body, and a first through hole, a second through hole, and a mounting slot are provided on the middle part of the body, the first through hole is connected between an inner cavity of the mounting slot and an inner cavity of the first pipe section, and the second through hole is connected between the inner cavity of the mounting slot and an inner cavity of the second pipe section;

the separation sheet is mounted in the mounting slot and divides the inner cavity of the mounting slot into a first sub-cavity and a second sub-cavity, the first water inlet channel is composed of the first sub-cavity and the first through hole, and the second water inlet channel is composed of the second sub-cavity and the second through hole;

the first water pump is mounted on an other end of the first pipe section, and the second water pump is mounted on an other end of the second pipe section;

the first water outlet channel is provided on the first pipe section, and the second water outlet channel is provided on the second pipe section.

Optionally, the center body further includes a base, the body of the center body is mounted on the base, and the water inlet and the water outlet are provided on the base.

Optionally, the center module further includes a flow guiding plate, the flow guiding plate is mounted on the base, and a flow guiding groove and a flow guiding hole are provided on the flow guiding plate, the flow guiding groove is used to communicate the water inlet with the first water inlet channel and the second water inlet flow channel, and the flow guiding hole is used to communicate the third water cavity with the first water outlet channel and the second water outlet channel.

Optionally, the water cooling head further includes an outer cover, the outer cover is fixedly connected to the base, and the body of the center body, the first water pump, and the second water pump are located inside the outer cover.

Optionally, the heat exchange module includes a mounting plate and a heat exchange member, and the heat exchange member is fixedly connected to the mounting plate and located in the third water cavity; the heat exchange member is configured to perform heat exchange on the cooling liquid flowing through the third water cavity.

Optionally, the heat exchange member is a foamy copper, the mounting plate is a copper plate, and the foamy copper is welded to the copper plate.

Optionally, the water cooling head further includes a water inlet joint mounted at the water inlet and a water outlet joint mounted at the water outlet.

In another aspect, an embodiment of the present disclosure provides a water cooling radiator, which includes a water tank, a water inlet pipe, a water outlet pipe, and the above-mentioned water cooling head. The water inlet pipe is connected between a water outlet of the water tank and the water inlet of the water cooling head, and the water outlet pipe is connected between a water inlet of the water tank and the water outlet of the water cooling head.

Optionally, the water cooling radiator is an integrated water cooling radiator.

In yet another aspect, an embodiment of the present disclosure provides an electronic equipment including the above-mentioned water cooling radiator.

Optionally, the electronic equipment further includes a CPU and a CPU radiator for cooling the CPU, the water tank is fixedly connected to the CPU radiator, and a cooling liquid in the water tank is used to cool the CPU radiator.

Optionally, the electronic equipment is a computer or a server.

The reference numerals in the description are as follows:
100. Water cooling head;
1, Center module; 11, Center body; 111, Body of the center body; 1111, Middle part of the body; 11111, First through hole; 11112, Second through hole; 11113, Mounting slot; 1113A, Inner cavity of the mounting slot; 11114, Clamping slot; 1112, First pipe section; 1112A, End of the first pipe section; 1112B, Inner cavity of the first pipe section; 1112C, An other end of the first pipe section; 1113, Second pipe section; 1113A, End of the second pipe section; 1113B, Inner cavity of the second pipe section; 1113C, An other end of the second pipe section; 112, Base; 113, First water outlet channel; 114, Second water outlet channel; 115, Water inlet; 116, Water outlet; 117, Liquid injection port; 118, First water inlet channel; 118A, First sub-cavity; 119, Second water inlet channel; 119A, Second sub-cavity; 12, Separation sheet; 121, First groove; 122, Second groove; 123, Separation body; 124, Separation plate; 125, Clamping block; 126, Baffler; 13, Flow guiding plate; 131, Flow guiding groove; 132, Flow guiding hole; 133, Anti-overflow groove; 134, Gap; 600, CPU.

2, First water pump; 21, Impeller of the first water pump; 211, First connection end; 212, First flowing water end; 2121, First water inlet hole; 2122, First water outlet hole; 22, Driving assembly of the first water pump; 221, First control board; 222, First stator; 223, First rotating shaft; 224, First housing;

3, Second water pump; 31, Impeller of the second water pump; 311, Second connection end; 312, Second flowing water end; 3121, Second water inlet hole; 3122, Second water outlet hole; 32, Driving assembly of the second water pump; 321, Second control board; 322, Second stator; 323, Second rotating shaft; 324, Second housing;

4, Heat exchange module; 41, Mounting plate; 42, Heat exchange member;

5, First water cavity;

6, Second water cavity;

7, Third water cavity;

8, Outer cover

91, Water inlet joint; 92, Water outlet joint;

10, Sealing plug;

200, Water tank; 201, Water outlet of the water tank; 202, Water inlet of the water tank;

300, Water inlet pipe; 400, Water outlet pipe;

500, CPU radiator.

DETAILED DESCRIPTION

In order to make the technical problems, technical solutions and beneficial effects solved by the present disclosure clearer, the present disclosure will be further described in detail below with reference to the accompanying drawings and embodiments. It should be understood that the specific embodiments described herein are only used to explain the present disclosure and are not intended to limit the present disclosure.

Figure 1:
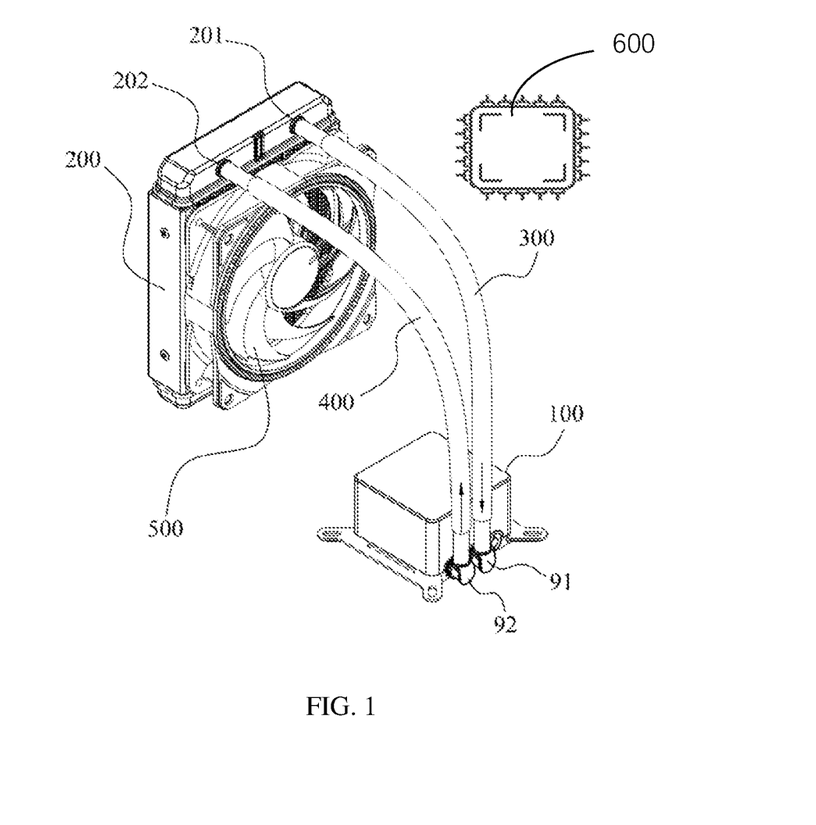
FIG. 1 is a schematic diagram of a water cooling radiator according to an embodiment of the present disclosure.

As shown in FIG. 1, a water cooling radiator provided by an embodiment of the present disclosure includes a water tank 200, a water inlet pipe 300, a water outlet pipe 400, and a water cooling head 100. The water inlet pipe 300 is connected between a water outlet 201 of the water tank 200 and a water inlet 115 of the water cooling head 100, and the water outlet pipe 400 is connected between a water inlet 202 of the water tank 200 and a water outlet 116 of the water cooling head 100.

As shown in FIGS. 1-15, the water cooling head 100 according to an embodiment of the present disclosure includes a center module 1, a first water pump 2, a second water pump 3, and a heat exchange module 4. The center module 1 is provided with a first water inlet channel 118, a second water inlet channel 119, a first water outlet channel 113, a second water outlet channel 114, the water inlet 115, and the water outlet 116. A first water pump 2, a second water pump 3, and the heat exchange module 4 are respectively mounted on the center module 1. A first water cavity 5 is enclosed between the first water pump 2 and the center module 1, a second water cavity 6 is enclosed between the second water pump 3 and the center module 1, and a third water cavity 7 is enclosed between the heat exchange module 4 and the center module 1.

A first water inlet channel 118 and a second water inlet channel 119 communicate with the water inlet 115, respectively. The first water cavity 5 communicates between the first water inlet channel 118 and the first water outlet channel 113. The second water cavity 6 communicates between the second water inlet channel 119 and the second water outlet channel 114. The first water outlet channel 113 and the second water outlet channel 114 communicate with the third water cavity 7, respectively. The third water cavity 7 communicates with the water outlet 116.

The first water pump 2 is used to introduce the cooling liquid from the water inlet 115 which passes through the first water inlet channel 118, the first water cavity 5, the first water outlet channel 113, and the third water cavity 7 in sequence, and discharge the cooling liquid from the water outlet 116.

The second water pump 3 is used to introduce the cooling liquid from the water inlet 115 which passes through the second water inlet channel 119, the second water cavity 6, the second water outlet channel 114, and the third water cavity 7 in sequence, and discharge the cooling liquid from the water outlet 116.

The heat exchange module 4 is used to perform heat exchange on the cooling liquid which flows through the third water cavity 7.

The water cooling head 100 according to the embodiment of the present disclosure drives the cooling liquid to flow by two water pumps (the first water pump 2 and the second water pump 3), so that the cooling liquid can flow into the water cooling head 100 from the water inlet 115 under the action of the two water pumps. After that, a part of the cooling liquid flows through the first water inlet channel 118 and into the first water cavity 5 under the action of the first water pump 2, and then flows through the first water outlet channel 113 and into the third water cavity 7. Another part of the cooling liquid flows through the second water inlet channel 119 and into the second water cavity 6 under the action of the second water pump 3, and then flows through the second water outlet channel 114 and into the third water cavity 7. The cooling liquid entering the third water cavity 7 is subjected to heat exchange by the heat exchange module 4, and finally flows out from the water outlet 116. Compared with the prior art, since the water cooling head 100 according to the embodiment of the present disclosure uses two water pumps, the total flow capacity of the cooling liquid is increased, thereby effectively enhancing the cooling effect of the water cooling head 100 and the water cooling radiator including the water cooling head 100. In addition, even if one of the water pumps in the water cooling head 100 according to the embodiment of the present disclosure fails, the other water pump can still work normally, which effectively prevents the water cooling radiator from not working properly due to failure of a single water pump (the first water pump 2 or the second water pump 3), which causes the CPU to be burnt out.

Figure 3:
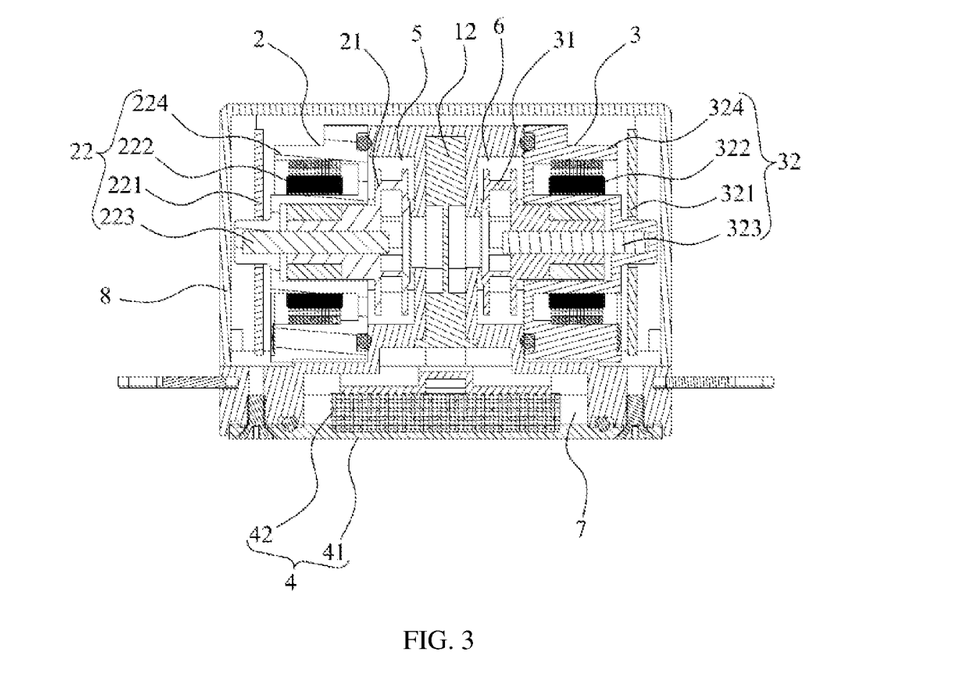
FIG. 3 is a cross-sectional view of a water cooling head according to an embodiment of the present disclosure.
Figure 4:
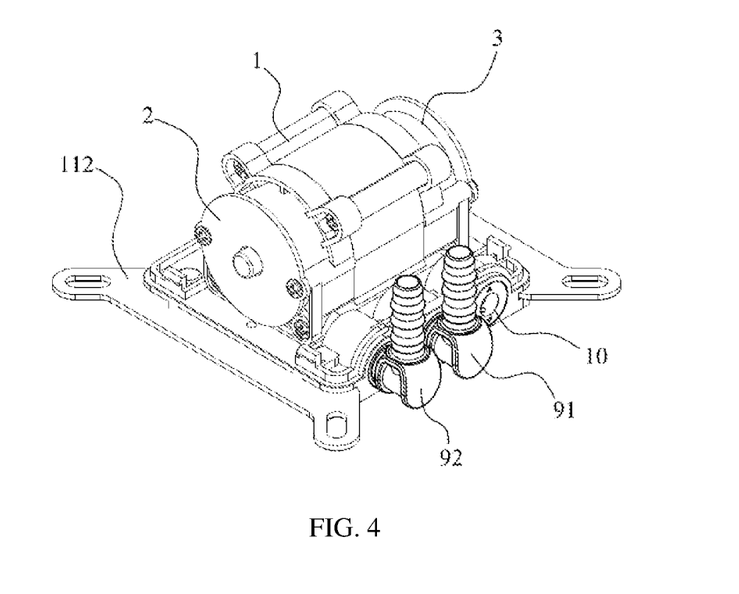
FIG. 4 is a schematic diagram of a water cooling head with an outer cover removed according to an embodiment of the present disclosure.
Figure 5:
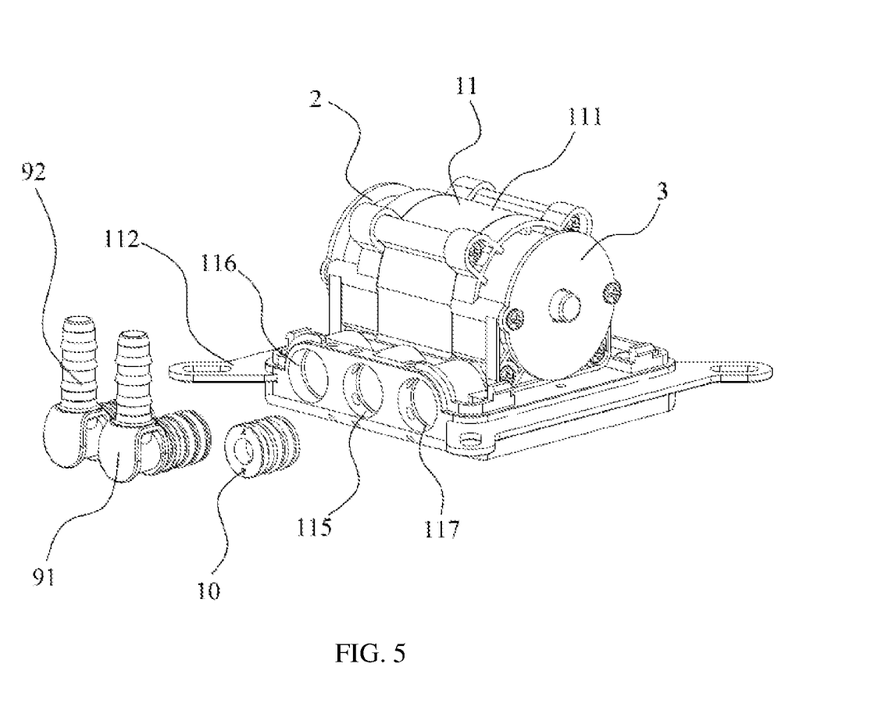
FIG. 5 is a partially exploded view of a water cooling head with an outer cover removed viewed by another angle according to an embodiment of the present disclosure.

In an embodiment, as shown in FIGS. 3-5, the first water pump 2 and the second water pump 3 are oppositely disposed on both sides of the center module 1 to respectively drive the cooling liquid to flow and to reduce the interference between the first water pump 2 and the second water pump 3.

Figure 6:
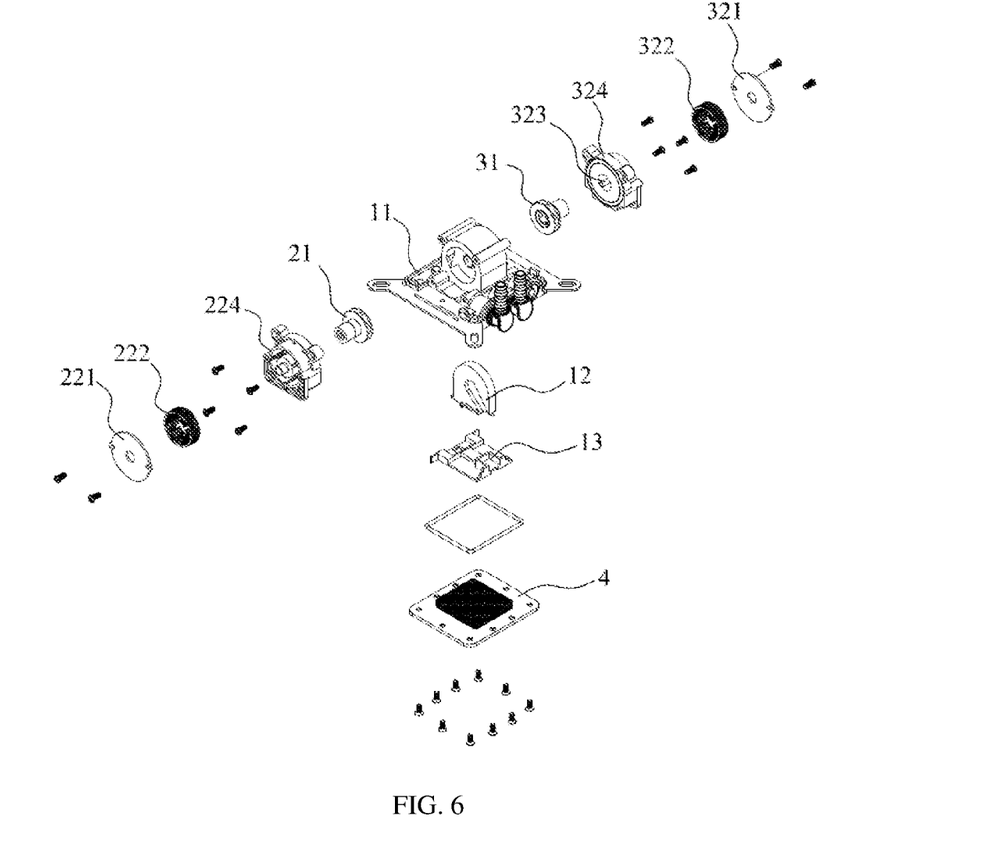
FIG. 6 is an exploded view of a water cooling head with an outer cover removed according to an embodiment of the present disclosure.

In an embodiment, as shown in FIGS. 3 and 6, the first water pump 2 and the second water pump 3 are both impeller pumps. The impeller 21 of the first water pump 2 is located in the first water cavity 5, and the impeller 31 of the second water pump 3 is located in the second water cavity 6.

When the impeller 21 of the first water pump 2 rotates, the existing cooling liquid in the first water cavity 5 will flow in the direction of rotation of the impeller 21 of the first water pump 2. The cooling liquid is driven to flow from the water inlet 115, through the first water inlet channel 118, and into the first water cavity 5. The existing cooling liquid in the first water cavity 5 flows through the first water outlet channel 113 and into the third water cavity 7, is cooled by the heat exchange module 4, and then flows out from the water outlet 116.

When the impeller 31 of the second water pump 3 rotates, the existing cooling liquid in the second water cavity 6 will flow in the direction of rotation of the impeller 31 of the second water pump 3. The cooling liquid is driven to flow from the water inlet 115, through the second water inlet channel 119, and into the second water cavity 6. The existing cooling liquid in the second water cavity 6 flows through the second water outlet channel 114 and into the third water cavity 7, is cooled by the heat exchange module 4, and then flows out from the water outlet 116.

In an embodiment, as shown in FIGS. 3 and 6, the impeller 21 of the first water pump 2 and the impeller 31 of the second water pump 3 rotate oppositely and independently.

Figure 15:
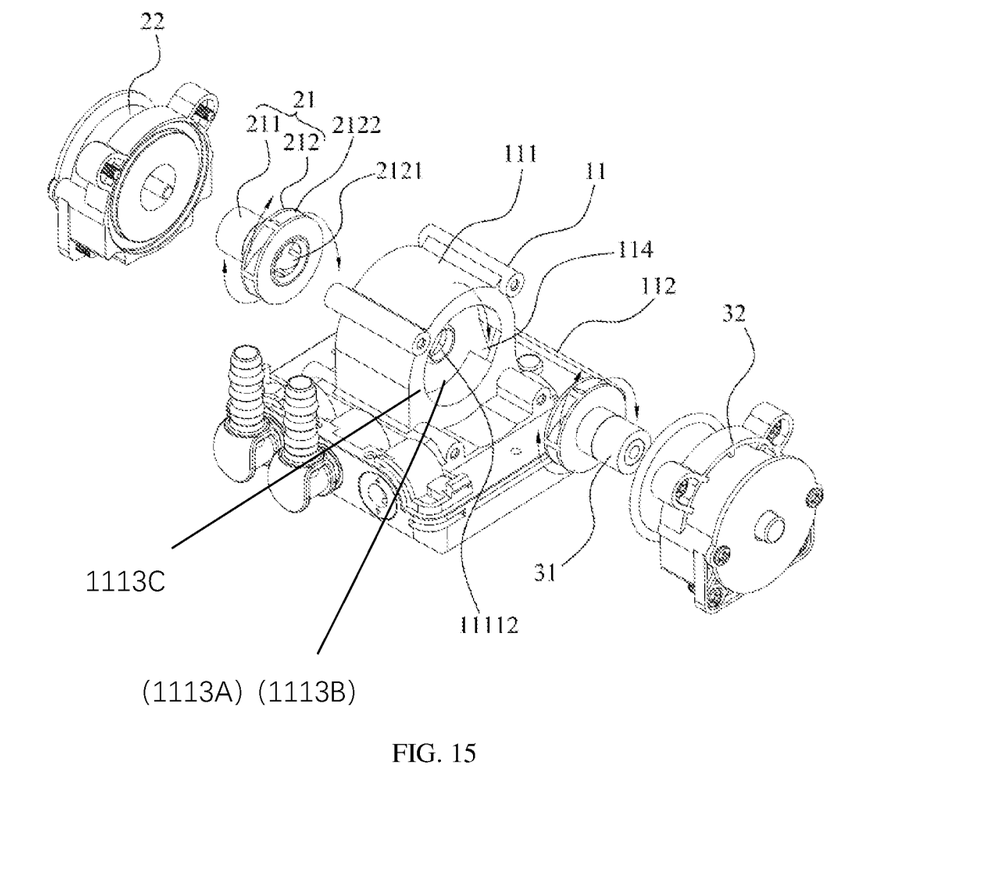
FIG. 15 is a working principle diagram of a water cooling head according to an embodiment of the present disclosure.

The first water pump 2 and the second water pump 3 in the water cooling head 100 according to the embodiment of the present disclosure can work independently, so that the impeller 21 of the first water pump 2 and the impeller 31 of the second water pump 3 can rotate oppositely and independently. It can be used as a backup for each other. Even if one of the water pumps of the water cooling head 100 fails, the other water pump can still work normally, which effectively prevents the water cooling radiator from being not capable of working normally due to failure of a single water pump, thereby extending the life of the electronic devices of the radiator and preventing the CPU from being burnt out. In an embodiment, as shown in FIGS. 6 and 15, the impeller 21 of the first water pump 2 includes a first connection end 211 and a first flowing water end 212. The first flowing water end 212 is provided with a first water inlet hole 2121 and a first water outlet hole 2122 communicating with the first water inlet hole 2121. The first connection end 211 is mounted on the driving assembly 22 of the first water pump 2. The first flowing water end 212 is rotatably connected with the center module 1, the first water inlet hole 2121 is in communication with the first water inlet channel 118, and the first water outlet hole 2122 is in communication with the first water cavity 5.

When the driving assembly 22 of the first water pump 2 works, the impeller 21 of the first water pump 2 is driven to rotate as a whole through the connection with the first connection end 211. After the cooling liquid flows into the first water inlet channel 118, it will first flow into the first water inlet hole 2121 communicating with the first water inlet channel 118, and then be thrown into the first water cavity 5 from the first water outlet hole 2122 under the action of the centrifugal force generated by the rotation of the impeller 21 of the first water pump 2.

In an embodiment, as shown in FIGS. 3 and 6, the driving assembly 22 of the first water pump 2 may be a motor. Specifically, the driving assembly 22 of the first water pump 2 includes a first control board 221, a first stator 222, a first rotor (not shown), a first rotating shaft 223, and a first housing 224. The first stator 222 is fixedly connected to the first housing 224, the first rotor is rotatably connected to the first housing 224, the first rotor is fixedly connected to the first rotating shaft 223, an end of the first rotating shaft 223 is fixedly connected to the impeller 21 of the first water pump 2, the first housing 224 is fixedly connected to the center module 1, the first control board 221 is fixedly connected to a side of the first housing 224 facing away from the center module 1, and the first control board 221 is electrically connected to the coil of the first stator 222.

When the driving assembly 22 of the first water pump 2 is in operation, the first control board 221 transmits the current to the coil of the first stator 222, and the first rotor can rotate relative to the first stator 222 and drive the first rotating shaft 223 to rotate so as to allow the impeller 21 of the first water pump 2 fixedly connected to the first rotating shaft 223 to rotate.

In an embodiment, in order to make the impeller 21 of the first water pump 2 rotate better with the first rotating shaft 223 and make the effect of the first water pump 2 better, the axis of the first rotating shaft 223 may be configured to be on the same straight line as the axis of the impeller 21 of the first water pump 2.

Figure 7:
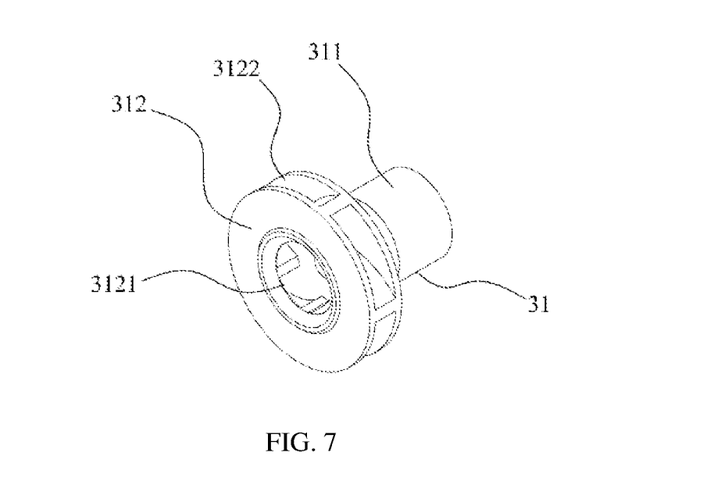
FIG. 7 is a schematic diagram of a second impeller of a water cooling head according to an embodiment of the present disclosure.

In an embodiment, as shown in FIGS. 6 and 7, the impeller 31 of the second water pump 3 includes a second connection end 311 and a second flowing water end 312. The second flowing water end 312 is provided with a second water inlet hole 3121 and a second water outlet hole 3122 communicating with the second water inlet hole 3121. The second connection end 311 is mounted on the driving assembly 32 of the second water pump 3. The second flowing water end 312 is rotatably connected to the center module 1, the second water inlet hole 3121 is in communication with the second water inlet channel 119, and the second water outlet hole 3122 is in communication with the second water cavity 6.

When the driving assembly 32 of the second water pump 3 works, the impeller 31 of the second water pump 3 is driven to rotate as a whole through the connection with the second connection end 311. After the cooling liquid flows into the second water inlet channel 119, it will first flow into the second water inlet hole 3121 communicating with the second water inlet channel 119, and then be thrown into the second water cavity 6 from the second water outlet hole 3122 under the action of the centrifugal force generated by the rotation of the impeller 31 of the second water pump 3.

In an embodiment, as shown in FIGS. 3 and 6, the driving assembly 32 of the second water pump 3 may also be a motor. Specifically, the driving assembly 32 of the second water pump 3 includes a second control board 321, a second stator 322, a second rotor (not shown), a second rotating shaft 323, and a second housing 324. The second stator 322 is fixedly connected to the second housing 324, the second rotor is rotatably connected to the second housing 324, the second rotor is fixedly connected to the second rotating shaft 323, an end of the second rotating shaft 323 is fixedly connected to the impeller 31 of the second water pump 3, the second housing 324 is fixedly connected to the center module 1, the second control board 321 is fixedly connected to a side of the second housing 324 facing away from the center module 1, and the second control board 321 is electrically connected to the coil of the second stator 322.

When the driving assembly 32 of the second water pump 3 is in operation, the second control board 321 transmits the current to the coil of the second stator 322, and the second rotor can rotate relative to the second stator 322 and drive the second rotating shaft 323 rotate so as to allow the impeller 31 of the second water pump 3 fixedly connected to the second rotating shaft 323 to rotate.

In an embodiment, in order to make the impeller 31 of the second water pump 3 rotate better with the second rotating shaft 323 and make the effect of the second water pump 3 better, the axis of the second rotating shaft 323 may be configured to be on the same straight line as the axis of the impeller 31 of the second water pump 3.

In an embodiment, as shown in FIGS. 6, 8 and 12 to 15, the center module 1 includes a center body 11 and a separation sheet 12, and the center body 11 includes a body of the center body 111, and the body of the center body 111 includes a middle part of the body 1111, a first pipe section 1112, and a second pipe section 1113. One end of the first pipe section 1112 and one end of the second pipe section 1113 are respectively connected to the middle part of the body 1111, and the middle part of the body 1111 is provided with a first through hole 11111, a second through hole 11112, and a mounting slot 11113. The first through hole 11111 is connected between an inner cavity of the mounting slot 11113 and an inner cavity of the first pipe section 1112. The second through hole 11112 is connected between an inner cavity of the mounting slot 11113 and an inner cavity of the second pipe section 1113.

The separation sheet 12 is mounted in the mounting slot 11113 and divides the inner cavity of the mounting slot 11113 into a first sub-cavity and a second sub-cavity. The first water inlet channel 118 is composed of the first sub-cavity and the first through hole 11111, and the second water inlet channel 119 is composed of the second sub-cavity and the second through hole 11112, so that the cooling liquid can flow into the first water cavity 5 and the second water cavity 6.

The first water pump 2 is mounted on the other end of the first pipe section 1112. The first water cavity 5 is enclosed by surfaces of the first water pump 2, the first pipe section 1112, and the middle part of the body 1111 facing the first pipe section 1112.

The second water pump 3 is mounted on the other end of the second pipe section 1113. The second water cavity 6 is enclosed by surfaces of the second water pump 3, the second pipe section 1113, and the middle part of the body 1111 facing the second pipe section 1113.

In order to allow the cooling liquid in the first water cavity 5 and the second water cavity 6 to flow out, the first water outlet channel 113 may be provided on the first pipe section 1112, and the second water outlet channel 114 is provided on the second pipe section 1113.

In an embodiment, as shown in FIGS. 3 to 5, when the first water pump 2 and the second water pump 3 are oppositely disposed on both sides of the center module 1, the rotation axis of the impeller 21 of the first water pump 2 is parallel with the rotation axis of the impeller 31 of the second water pump 3, and is perpendicular to the separation sheet 12.

Figure 9:
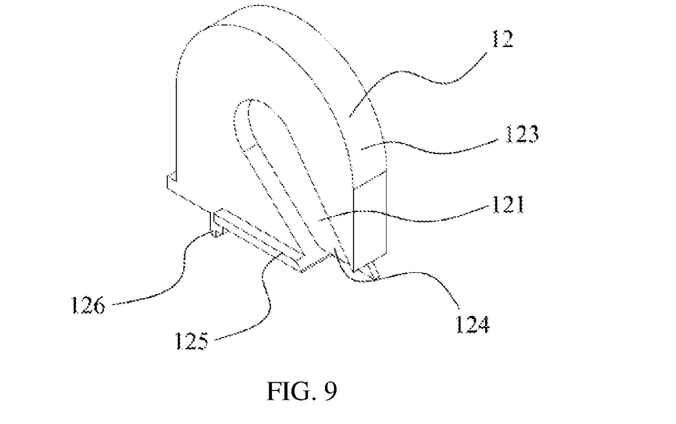
FIG. 9 is a schematic diagram of a separation sheet of a water cooling head according to an embodiment of the present disclosure.
Figure 12:
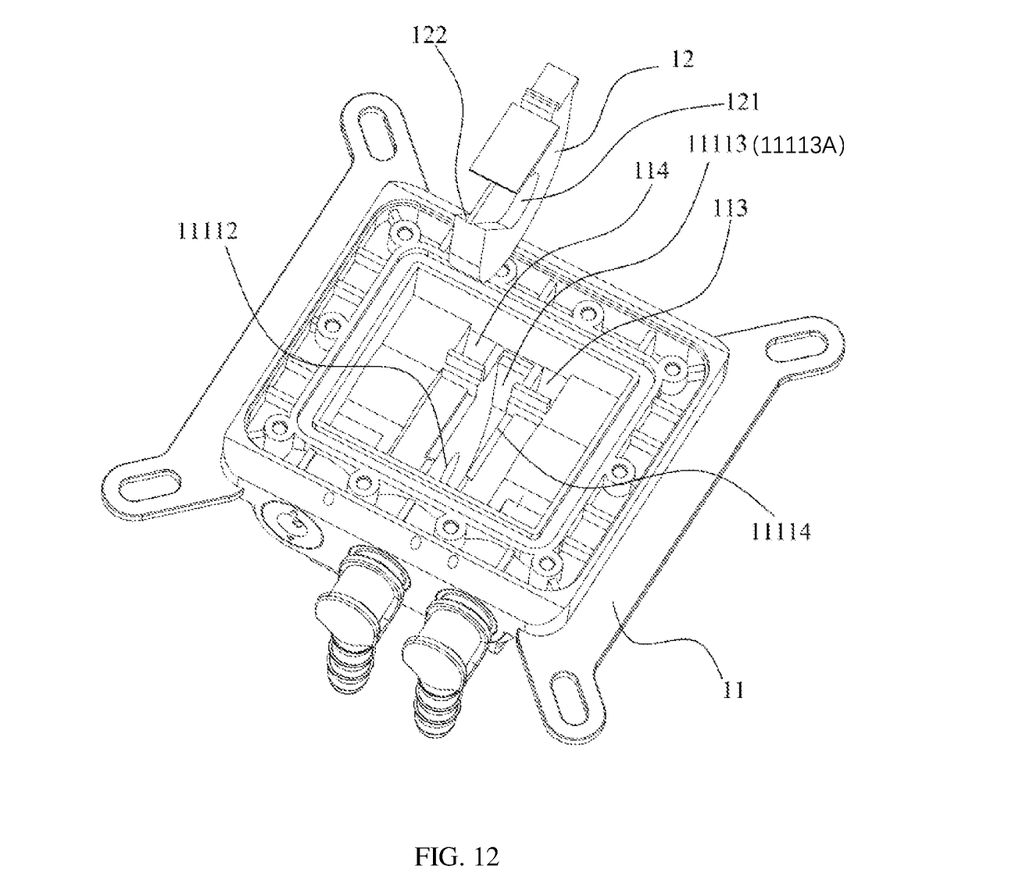
FIG. 12 is an assembly schematic diagram of a separation sheet and a center body of a water cooling head according to an embodiment of the present disclosure.
Figure 13:
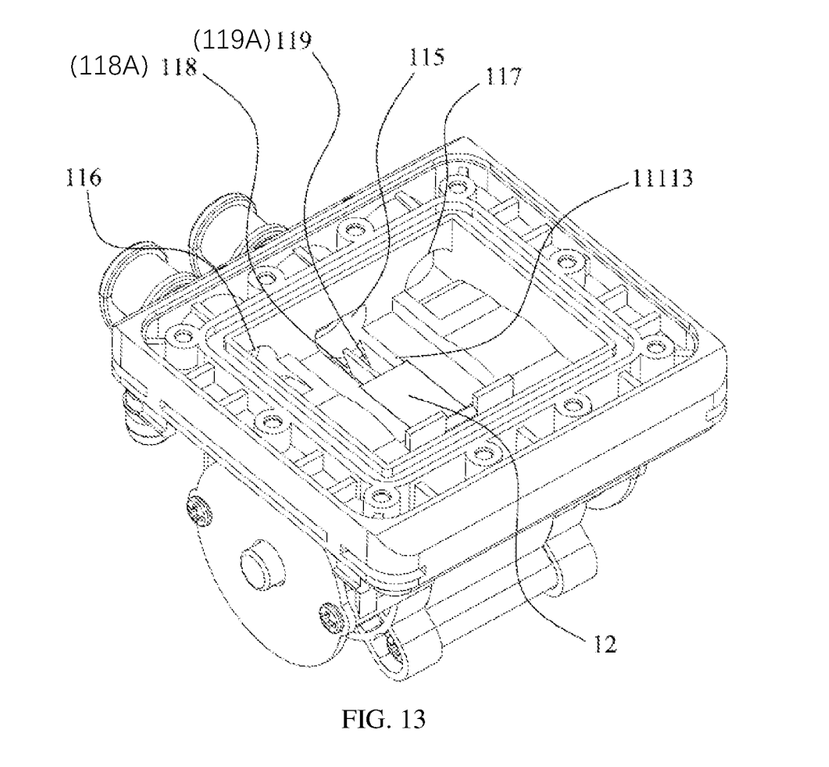
FIG. 13 is a schematic diagram of a separation sheet and a center body of a water cooling head after being assembled according to an embodiment of the present disclosure.
Figure 14:
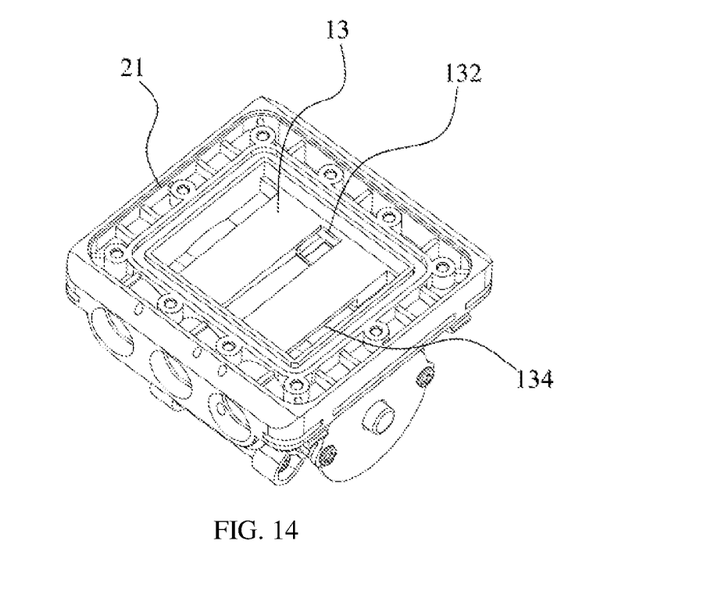
FIG. 14 is a schematic diagram of a water cooling head with a heat exchange module removed according to an embodiment of the present disclosure.

In an embodiment, as shown in FIGS. 9 and 12, the separation sheet 12 is provided with a first groove 121 and a second groove 122 which are not in communication with each other. The first groove 121 communicates with the first through hole 11111 through the first sub-cavity to form the first water inlet channel 118, and the second groove 122 communicates with the second through hole 11112 through the second sub-cavity to form the second water inlet channel 119.

In one embodiment, as shown in FIGS. 9 and 12, the separation sheet 12 includes a separation body 123 and a separation plate 124. The separation body 123 is in a "U" shape. An opening of the separation body 123 is in communication with the water inlet 115, and the separation plate 124 is fixedly connected to the inner side wall of the separation body 123 to form the first groove 121 and the second groove 122 on the separation sheet 12.

The cooling liquid will enter the first groove 121 and the second groove 122 through the opening of the separation body 123, and then flow into the first water cavity 5 and the second water cavity 6, respectively.

In an embodiment, as shown in FIG. 9, the separation sheet 12 further includes a clamping block 125, which is connected to the separation body 123 and is located at an edge of the opening of the separation body 123. The middle portion of the body 1111 is provided with a clamping slot 11114 adapted to the clamping block 125 in shape, and the clamping block 125 is clamped in the clamping slot 11114 to further stabilize the connection between the separation sheet 12 and the center body 11.

Figure 8:
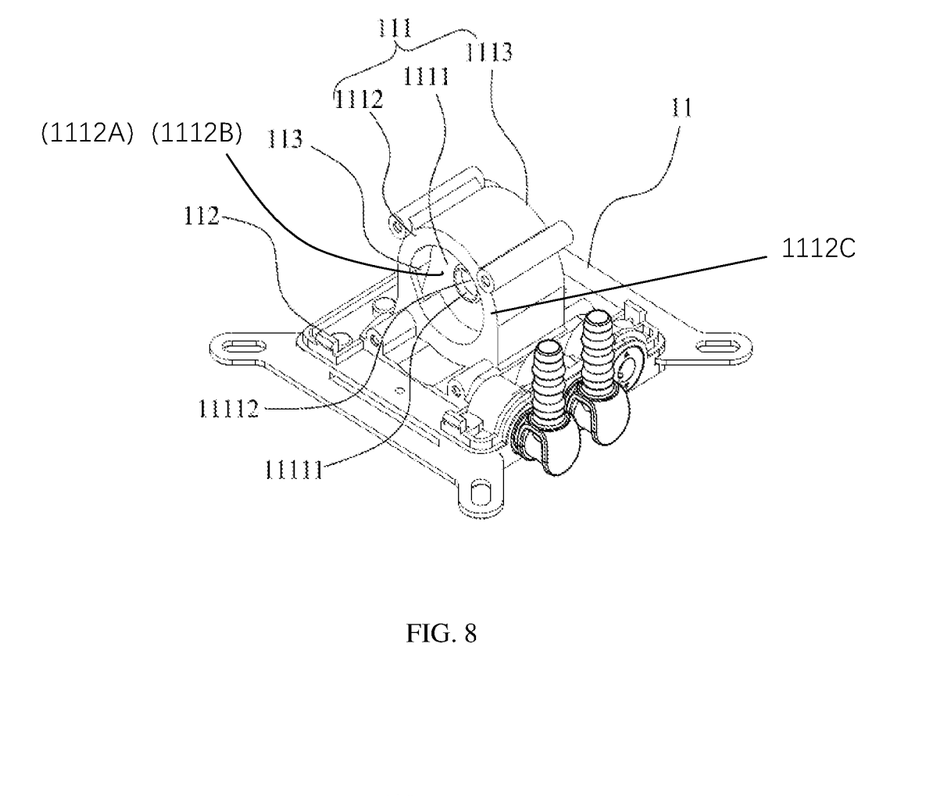
FIG. 8 is a schematic diagram of a center body of a water cooling head according to an embodiment of the present disclosure.

In an embodiment, as shown in FIG. 8, the center body 11 further includes a base 112. The body of the center body 111 is mounted on the base 112, and the water inlet 115 and the water outlet 116 are provided on the base 112.

Figure 10:
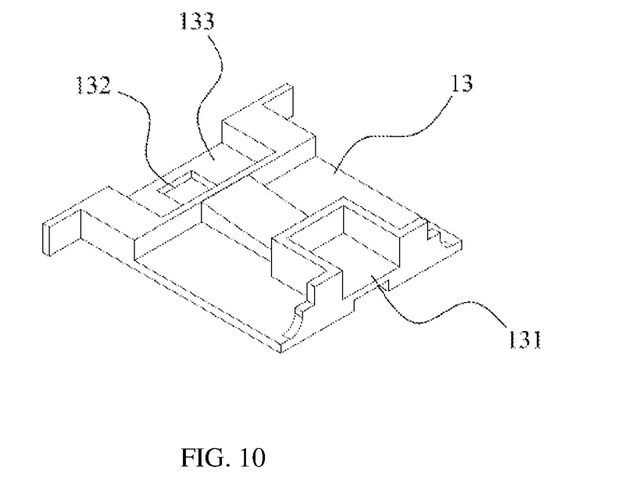
FIG. 10 is a schematic diagram of a flow guiding plate of a water cooling head according to an embodiment of the present disclosure.

In an embodiment, as shown in FIGS. 6 and 10, the center module 1 further includes a flow guiding plate which is mounted on the base 112, and the flow guiding plate is provided with a flow guiding groove 131 and a flow guiding hole 132. The flow guiding groove 131 is used for communicating the water inlet 115 with the first water inlet channel 118 and the second water inlet channel 119 to ensure that the cooling liquid can flow into the first water inlet channel 118 and the second water inlet channel 119 through the water inlet 115. The flow guiding hole 132 is used for communicating the third water cavity 7 with the first water outlet channel 113 and the second water outlet channel 114 to ensure that the cooling liquid in the first water outlet channel 113 and the second water outlet channel 114 can flow into the third water cavity 7.

In an embodiment, as shown in FIGS. 6 and 10, the flow guiding plate 13 is further provided with an anti-overflow groove 133, the anti-overflow groove 133 communicates with the first water outlet channel 113 and the second water outlet channel 114, and the flow guiding hole 132 is located at the bottom of the anti-overflow groove 133.

After the cooling liquid flows into the anti-overflow groove 133 through the first water outlet channel 113 and the second water outlet channel 114, the cooling liquid can flow into the third water cavity 7 through the flow guiding hole 132 located at the bottom of the anti-overflow groove 133.

In an embodiment, as shown in FIGS. 9 and 10, in order to ensure that the cooling liquid flowing out from the first water outlet channel 113 and the second water outlet channel 114 can directly flow into the anti-overflow groove 133, and prevent the cooling liquid from flowing towards the direction in which the flow guiding groove 131 locates when the cooling liquid flows out through the first water outlet channel 113 and the second water outlet channel 114. The separation sheet 12 further includes a baffler 126 connected to the separation body 123. The baffler 126 is located on a side of the clamping block 125 facing away from the opening of the separation body 123. The Baffler 126 abuts on an inner wall of the anti-overflow groove 133.

Figure 2:
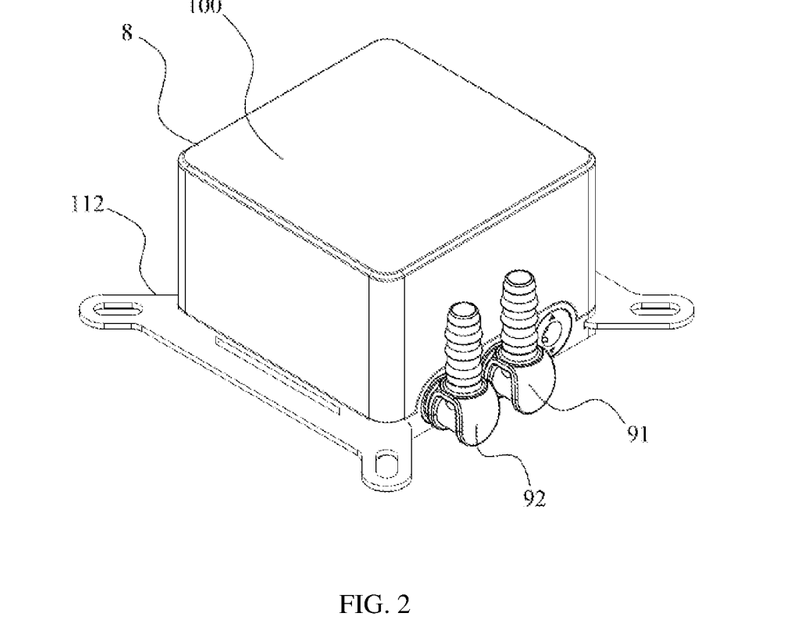
FIG. 2 is a schematic diagram of a water cooling head according to an embodiment of the present disclosure.

In an embodiment, as shown in FIGS. 2 and 3, to protect the body of the center body 111, the first water pump 2 and the second water pump 3, the water cooling head 100 further includes an outer cover 8 fixedly connected to the base 112, and the body of the center body 111, the first water pump 2 and the second water pump 3 are located in the outer cover 8.

Figure 11:
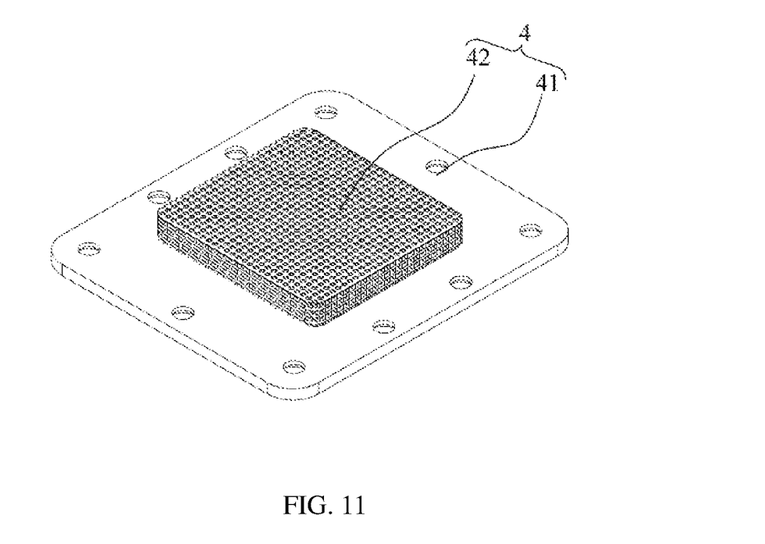
FIG. 11 is a schematic diagram of a heat exchange module of a water cooling head according to an embodiment of the present disclosure.

In an embodiment, as shown in FIGS. 6 and 11, the heat exchange module 4 includes a mounting plate 41 and a heat exchange member 42. The heat exchange member 42 is fixedly connected to the mounting plate 41 and is located in the third water cavity 7. The heat exchange member 42 is used for heat exchanging of the cooling liquid flowing through the third water cavity 7.

In an embodiment, as shown in FIGS. 6 and 11, the heat exchange member 42 is foamy copper, the mounting plate 41 is a copper plate, and the foamy copper is welded to the copper plate to enable heat conduction between the foamy copper and the copper plate to better improve the cooling effect.

In an embodiment, as shown in FIG. 3, the rotation axis of the impeller 21 of the first water pump 2 and the rotation axis of the impeller 31 of the second water pump 3 are both parallel with the plane where the foamy copper is located.

In an embodiment, as shown in FIGS. 3 and 6, the foamy copper is mounted directly below the flow guiding plate so that the cooling liquid flowing out from the flow guiding hole 132 can directly flow to the foamy copper to improve cooling effect.

In an embodiment, as shown in FIG. 5, in order to conveniently connect the water cooling head 100 to the water cooling radiator, the water cooling head 100 further includes a water inlet joint 91 mounted at the water inlet 115 and a water outlet joint 92 mounted at the water outlet 116.

In an embodiment, as shown in FIG. 5, the center body 11 is further provided with a liquid injection port 117. Before the water cooling head 100 is used, a user can inject the cooling liquid into the water cooling head 100 through the liquid injection port 117, and then block the liquid injection port 117 by a sealing plug 10 after the water cooling head 100 is filled with the cooling liquid so as to prevent the cooling liquid in the center body 11 from overflowing from the liquid injection port 117.

In one embodiment, the water cooling radiator is an integrated water cooling radiator.

The working principle of the water cooling radiator and the water cooling head 100 according to the embodiment of the present disclosure is as follows:

when the water cooling radiator works, the first water pump 2 and the second water pump 3 in the water cooling head 100 work, driving the impeller 21 of the first water pump 2 and the impeller 31 of the second water pump 3 to rotate, thereby driving the cooling liquid to flow from the water tank 200, through the water outlet 201 of the water tank 200, the water inlet pipe 300, and the water inlet 115 of the water cooling head 100 in sequence, and into the water cooling head 100.

A part of the cooling liquid entering the water cooling head 100 flows through the first water inlet channel 118, the first water cavity 5, the first water outlet channel 113 and the flow guiding hole 132 of the flow guiding plate 13 in sequence, and into the third water cavity 7. Another part flows through the second water inlet channel 119, the second water cavity 6, the second water outlet channel 114 and the flow guiding hole 132 of the flow guiding plate 13 in sequence, and into the third water cavity 7.

The cooling liquid flowing into the third water cavity 7 is cooled by the foamy copper, and then flows from the water outlet 116, through the gap 134 (shown in FIG. 9) between the flow guiding plate 13 and the foamy copper, and flows out from the water cooling head 100.

The cooled cooling liquid flowing out from the water cooling head 100 flows back into the water tank 200 through the water outlet pipe 400 and the water inlet 202 of the water tank 200, so that the water tank 200 cools down the electronic devices.

The electronic equipment according to an embodiment of the present disclosure includes the above-mentioned water cooling radiator, and further includes a CPU and a CPU radiator 500 for radiating the CPU. The water tank 200 is fixedly connected to the CPU radiator 500. The cooling liquid in the water tank 200 is used to cool the CPU radiator 500.

When the water cooling radiator is mounted on the electronic equipment, to better achieve the cooling effect, the center axis of the impeller 21 of the first water pump 2 may be configured to be not perpendicular to the plane where the CPU of the electronic equipment is located, and the impeller 31 of the second water pump 3 may be configured to be not perpendicular to the plane where the CPU of the electronic equipment is located. In an embodiment, the electronic equipment according to the embodiment of the present disclosure may be a computer or a server. That is, the water cooling radiator and the water cooling head 100 according to the embodiment of the present disclosure can be applied in the computer or server industry.

Further, unless otherwise required by context, singular terms shall include pluralities and plural terms shall include the singular. Thus, as used herein and in the claims, the singular forms include the plural reference and vice versa unless the context clearly indicates otherwise.

The above description is only the preferred embodiments of the present disclosure and is not intended to limit the present disclosure. Any modification, equivalent replacement, and improvement made within the spirit and principle of the present disclosure shall be included in the scope of the protection of the present disclosure.

What is claimed is:

1. A water cooling head, comprising a center module, a first water pump, a second water pump, and a heat exchange module;
   wherein the center module is provided with a first water inlet channel, a second water inlet channel, a first water outlet channel, a second water outlet channel, a water inlet, and a water outlet;
   the first water pump, the second water pump, and the heat exchange module are respectively mounted on the center module;
   a first water cavity is enclosed between the first water pump and the center module, a second water cavity is enclosed between the second water pump and the center module, and a third water cavity is enclosed between the heat exchange module and the center module;
   the first water inlet channel and the second water inlet channel respectively communicate with the water inlet, the first water cavity communicates between the first water inlet channel and the first water outlet channel, the second water cavity communicates between the second water inlet channel and the second water outlet channel, the first water outlet channel and the second water outlet channel respectively communicate with the third water cavity, and the third water cavity communicates with the water outlet;
   the first water pump is used to introduce a cooling liquid from the water inlet which passes through the first water inlet channel, the first water cavity, the first water outlet channel, and the third water cavity in sequence, and discharge the cooling liquid from the water outlet;
   the second water pump is used to introduce the cooling liquid from the water inlet which passes through the second water inlet channel, the second water cavity the second water outlet channel, and the third water cavity in sequence, and discharge the cooling liquid from the water outlet; and
   the heat exchange module is used to perform heat exchange on the cooling liquid which flows through the third water cavity;
   the first water pump and the second water pump are both impeller pumps, an impeller of the first water pump is located in the first water cavity, and an impeller of the second water pump is located in the second water cavity; and
   the impeller of the first water pump and the impeller of the second water pump rotate oppositely and independently.

2. The water cooling head according to claim 1, wherein the center module comprises a center body and a separation sheet, the center body comprises a body of the center body, and the body of the center body comprises a middle part of the body, a first pipe section, and a second pipe section;

an end of the first pipe section and an end of the second pipe section are respectively connected to the middle part of the body, a first through hole, a second through hole, and a mounting slot are provided on the middle part of the body, the first through hole is connected between an inner cavity of the mounting slot and an inner cavity of the first pipe section, and the second through hole is connected between the inner cavity of the mounting slot and an inner cavity of the second pipe section;

the separation sheet is mounted in the mounting slot and divides the inner cavity of the mounting slot into a first sub-cavity and a second sub-cavity, the first water inlet channel is composed of the first sub-cavity and the first through hole, and the second water inlet channel is composed of the second sub-cavity and the second through hole;

the first water pump is mounted on an other end of the first pipe section, and the second water pump is mounted on an other end of the second pipe section;

the first water outlet channel is provided on the first pipe section, and the second water outlet channel is provided on the second pipe section.

3. The water cooling head according to claim 2, wherein the center body further comprises a base, the body of the center body is mounted on the base, and the water inlet and the water outlet are provided on the base.

4. The water cooling head according to claim 3, wherein the center module further comprises a flow guiding plate, the flow guiding plate is mounted on the base, a flow guiding groove and a flow guiding hole are provided on the flow guiding plate, the flow guiding groove is used to communicate the water inlet with the first water inlet channel and the second water inlet channel, and the flow guiding hole is used to communicate the third water cavity with the first water outlet channel and the second water outlet channel.

5. A water cooling radiator, comprising a water tank, a water inlet pipe, a water outlet pipe, and the water cooling head according to claim 4, wherein the water inlet pipe is connected between a water outlet of the water tank and the water inlet of the water cooling head, and the water outlet pipe is connected between a water inlet of the water tank and the water outlet of the water cooling head; and the water cooling radiator is an integrated water cooling radiator.

6. The water cooling head according to claim 3, further comprising an outer cover, the outer cover is fixedly connected to the base, and the body of the center body, the first water pump, and the second water pump are located inside the outer cover.

7. A water cooling radiator, comprising a water tank, a water inlet pipe, a water outlet pipe, and the water cooling head according to claim 6, wherein the water inlet pipe is connected between a water outlet of the water tank and the water inlet of the water cooling head, and the water outlet pipe is connected between a water inlet of the water tank and the water outlet of the water cooling head; and the water cooling radiator is an integrated water cooling radiator.

8. A water cooling radiator, comprising a water tank, a water inlet pipe, a water outlet pipe, and the water cooling head according to claim 3, wherein the water inlet pipe is connected between a water outlet of the water tank and the water inlet of the water cooling head, and the water outlet pipe is connected between a water inlet of the water tank and the water outlet of the water cooling head; and the water cooling radiator is an integrated water cooling radiator.

9. An electronic equipment, comprising a CPU, a CPU radiator, and the water cooling radiator according to claim 8, wherein the CPU radiator is used to cool the CPU; and the water tank is fixedly connected to the CPU radiator, and the cooling liquid in the water tank is used to cool the CPU radiator.

10. A water cooling radiator, comprising a water tank, a water inlet pipe, a water outlet pipe, and the water cooling head according to claim 2, wherein the water inlet pipe is connected between a water outlet of the water tank and the water inlet of the water cooling head, and the water outlet pipe is connected between a water inlet of the water tank and the water outlet of the water cooling head; and the water cooling radiator is an integrated water cooling radiator.

11. An electronic equipment, comprising a CPU, a CPU radiator, and the water cooling radiator according to claim 10, wherein the CPU radiator is used to cool the CPU; and the water tank is fixedly connected to the CPU radiator, and the cooling liquid in the water tank is used to cool the CPU radiator.

12. The water cooling head according to claim 1, wherein the heat exchange module comprises a mounting plate and a heat exchange member, and the heat exchange member is fixedly connected to the mounting plate and located in the third water cavity; the heat exchange member is configured to perform heat exchange on the cooling liquid flowing through the third water cavity.

13. The water cooling head according to claim 12, wherein the heat exchange member is a foamy copper, the mounting plate is a copper plate, and the foamy copper is welded to the copper plate.

14. A water cooling radiator, comprising a water tank, a water inlet pipe, a water outlet pipe, and the water cooling head according to claim 13, wherein the water inlet pipe is connected between a water outlet of the water tank and the water inlet of the water cooling head, and the water outlet pipe is connected between a water inlet of the water tank and the water outlet of the water cooling head; and the water cooling radiator is an integrated water cooling radiator.

15. A water cooling radiator, comprising a water tank, a water inlet pipe, a water outlet pipe, and the water cooling head according to claim 12, wherein the water inlet pipe is connected between a water outlet of the water tank and the water inlet of the water cooling head, and the water outlet pipe is connected between a water inlet of the water tank and the water outlet of the water cooling head; and the water cooling radiator is an integrated water cooling radiator.

16. A water cooling radiator, comprising a water tank, a water inlet pipe, a water outlet pipe, and the water cooling head according to claim 1, wherein the water inlet pipe is connected between a water outlet of the water tank and the water inlet of the water cooling head, and the water outlet pipe is connected between a water inlet of the water tank and the water outlet of the water cooling head; and the water cooling radiator is an integrated water cooling radiator.

17. An electronic equipment, comprising a CPU, a CPU radiator, and the water cooling radiator according to claim 16, wherein the CPU radiator is used to cool the CPU; and the water tank is fixedly connected to the CPU radiator, and the cooling liquid in the water tank is used to cool the CPU radiator.

\* \* \* \* \*